United States Patent
Choi et al.

(10) Patent No.: US 8,952,944 B2
(45) Date of Patent: Feb. 10, 2015

(54) STAGE CIRCUIT AND SCAN DRIVER USING THE SAME

(75) Inventors: In-Ho Choi, Yongin (KR); Bo-Yong Chung, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 267 days.

(21) Appl. No.: 13/452,789

(22) Filed: Apr. 20, 2012

(65) Prior Publication Data

US 2013/0002307 A1 Jan. 3, 2013

(30) Foreign Application Priority Data

Jun. 30, 2011 (KR) .................. 10-2011-0064436

(51) Int. Cl.
*H03K 3/00* (2006.01)
*H03K 19/00* (2006.01)

(52) U.S. Cl.
CPC ...................................... *H03K 19/00* (2013.01)
USPC ................ 345/204; 377/54; 377/64; 345/76; 345/82

(58) Field of Classification Search
CPC ............ G06G 3/14; G06G 3/34; G06G 5/00; G11C 19/00; H03M 1/12
USPC ........... 345/76, 84, 96, 99, 100, 204, 211, 82; 341/155; 377/54, 64
See application file for complete search history.

(56) References Cited

U.S. PATENT DOCUMENTS

| | | | |
|---|---|---|---|
| 6,556,646 B1 * | 4/2003 | Yeo et al. | 377/54 |
| 2007/0171115 A1 * | 7/2007 | Kim et al. | 341/155 |
| 2011/0227884 A1 * | 9/2011 | Chung | 345/204 |

FOREIGN PATENT DOCUMENTS

| | | |
|---|---|---|
| KR | 10-2007-0071703 A | 7/2007 |
| KR | 10-2010-0021130 A | 2/2010 |
| KR | 10-2010-0081146 A | 7/2010 |

* cited by examiner

*Primary Examiner* — Lun-Yi Lao
*Assistant Examiner* — Johny Lau
(74) *Attorney, Agent, or Firm* — Christie, Parker & Hale, LLP

(57) ABSTRACT

A stage circuit and a scan driver using the same that is capable of concurrently (e.g., simultaneously) or progressively supplying a scan signal to a plurality of scan lines. The stage circuit includes a progressive driver and a concurrent driver.

25 Claims, 13 Drawing Sheets

STAGE CIRCUIT AND SCAN DRIVER USING THE SAME

CROSS-REFERENCE TO RELATED APPLICATION

This application claims priority to and the benefit of Korean Patent Application No. 10-2011-0064436, filed on Jun. 30, 2011, in the Korean Intellectual Property Office, the entire content of which is incorporated herein by reference.

BACKGROUND

1. Field

Aspects of embodiments according to the present invention relate to a stage circuit and a scan driver using the same.

2. Description of Related Art

Flat panel display devices have been developed with reduced weight and volume in comparison to cathode ray tubes. The flat panel display devices include a liquid crystal display, a field emission display, a plasma display panel, an organic light emitting display, and the like.

Among these flat panel display devices, the organic light emitting display displays images using organic light emitting diodes that emit light through recombination of electrons and holes. The organic light emitting display has a fast response speed and is driven with low power consumption.

Generally, organic light emitting displays are classified into a passive matrix organic light emitting display (PMOLED) and an active matrix organic light emitting display (AMOLED), depending on a method of driving organic light emitting diodes.

The AMOLED includes a plurality of scan lines, a plurality of data lines, a plurality of power lines, and a plurality of pixels connected to these lines and arranged in a matrix form. Each of the pixels includes an organic light emitting diode, a driving transistor for controlling the amount of current supplied to the organic light emitting diode, a switching transistor for transmitting a data signal to the driving transistor, and a storage capacitor for maintaining the voltage of the data signal.

The driving method of the organic light emitting display is divided into a progressive emission method and a concurrent emission method (e.g., a simultaneous emission method). The progressive emission method refers to a method in which data is progressively inputted for each scan line, and pixels on each horizontal line are progressively emitted in the same order as the data is inputted.

The concurrent emission method refers to a method in which data is progressively inputted for each scan line, and pixels are concurrently (e.g., simultaneously) emitted after the data is inputted to all the pixels. In order to implement the concurrent emission method, a scan signal should be concurrently (e.g., simultaneously) or progressively supplied to the scan lines.

SUMMARY

Aspects of embodiments according to the present invention are directed toward a stage circuit and a scan driver using the same capable of concurrently (e.g., simultaneously) or progressively supplying a scan signal to a plurality of scan lines.

According to an embodiment of the present invention, there is provided a stage circuit including: a progressive driver including a first transistor coupled between a first power source and an output terminal of the stage circuit, a gate electrode of the first transistor being coupled to a first input terminal of the stage circuit; a second transistor coupled between the output terminal and a second input terminal of the stage circuit, a gate electrode of the second transistor being coupled to a first node; a third transistor coupled between the first node and a third input terminal of the stage circuit, a gate electrode of the third transistor being coupled to the first input terminal; a fourth transistor coupled between the first power source and the first node, and having a gate electrode of the fourth transistor being coupled to a fourth input terminal of the stage circuit; and a first capacitor coupled between the first node and the output terminal; and a concurrent driver including a fifth transistor coupled between the output terminal and a fifth input terminal of the stage circuit, a gate electrode of the fifth transistor being coupled to a second node.

The second node may be coupled to the fourth input terminal. The first and second input terminals may be configured to receive clock signals of which phases are opposite to each other. The first input terminal is configured to receive a first clock signal, and the second input terminal may be configured to receive a second clock signal that is not overlapped with the first clock signal during a low-voltage period. The third input terminal may be configured to receive an output signal of a previous stage circuit or a start signal in synchronization with the clock signal supplied to the first input terminal. The fourth input terminal may be configured to receive a first control signal, and the fifth input terminal may be configured to receive a second control signal.

The first control signal may be set to a high voltage during a period in which the progressive driver is configured to supply a scan signal, and may be set to a low voltage during a period in which the concurrent driver is configured to supply a scan signal. The second control signal may be set to a low voltage so that the scan signal is supplied to the output terminal during a portion of the period in which the first control signal is set to the low voltage.

The concurrent driver may further include a sixth transistor coupled between the second node and a second power source having a voltage lower than that of the first power source, a gate electrode of the sixth transistor being coupled to the fourth input terminal. The concurrent driver may further include a sixth transistor coupled between the second node and the fourth input terminal, a gate electrode of the sixth transistor being coupled to the fourth input terminal.

The concurrent driver may further include a seventh transistor coupled between the second node and the first power source, a gate electrode of the seventh transistor being coupled to the second input terminal; and a second capacitor coupled between the second node and the output terminal. The concurrent driver may further include a seventh transistor coupled between the second node and the first power source, a gate electrode of the seventh transistor being coupled to the first input terminal; and a second capacitor coupled between the second node and the output terminal. The progressive driver may further include a third capacitor coupled between the first node and the first power source.

According to an embodiment of the present invention, there is provided a scan driver including a plurality of stage circuits each configured according to one or more of the above described stage circuits. The stage circuits are respectively coupled to scan lines so as to supply a scan signal to the scan lines.

According to another embodiment of the present invention, there is provided a scan driver including stage circuits respectively coupled to scan lines so as to supply a scan signal to the scan lines, wherein a stage circuit of the stage circuits includes: a progressive driver including a first transistor coupled between a first power source and an output terminal of the stage circuit, a gate electrode of the first transistor being coupled to a first input terminal of the stage circuit; a second transistor coupled between the output terminal and a second input terminal of the stage circuit, a gate electrode of the second transistor being coupled to a first node; a third transistor coupled between the first node and a third input terminal of the stage circuit, a gate electrode of the third transistor being coupled to the first input terminal; a fourth transistor coupled between the first power source and the first node, a gate electrode of the fourth transistor being coupled to a fourth input terminal of the stage circuit; and a first capacitor coupled between the first node and the output terminal; and a concurrent driver including a fifth transistor coupled between the output terminal and a fifth input terminal of the stage circuit, a gate electrode of the fifth transistor being coupled to a second node.

The second node may be coupled to the fourth input terminal. The first input terminal of a k-th stage circuit (where k is an odd or even number) of the stage circuits may be configured to receive a first clock signal, and the second input terminal of the k-th stage circuit may be configured to receive a second clock signal having a phase that is opposite to that of the first clock signal; and the first input terminal of a (k+1)-th stage circuit of the stage circuits may be configured to receive the second clock signal, and the second input terminal of the (k+1)-th stage circuit may be configured to receive the first clock signal.

The first input terminal of a k-th stage circuit (where k is an odd or even number) of the stage circuits may be configured to receive a first clock signal, and the second input terminal of the k-th stage circuit may be configured to receive a third clock signal having a low voltage that is not overlapped with that of the first clock signal; and the first input terminal of a (k+1)-th stage circuit of the stage circuits may be configured to receive a second clock signal, and the second input terminal of the (k+1)-th stage circuit may be configured to receive a fourth clock signal having a low voltage that is not overlapped with that of the second clock signal. The first to fourth clock signals may be progressively supplied, and low voltages of previous and current clock signals may be overlapped with each other during a partial period.

In the stage circuit and the scan driver using the same according to the embodiments of the present invention, a scan signal can be progressively or concurrently (e.g., simultaneously) supplied to scan lines. Further, stages are driven using two pulse signals, so that the stage circuit can be implemented as a relatively simple circuit.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE EMBODIMENTS

Figure 1:
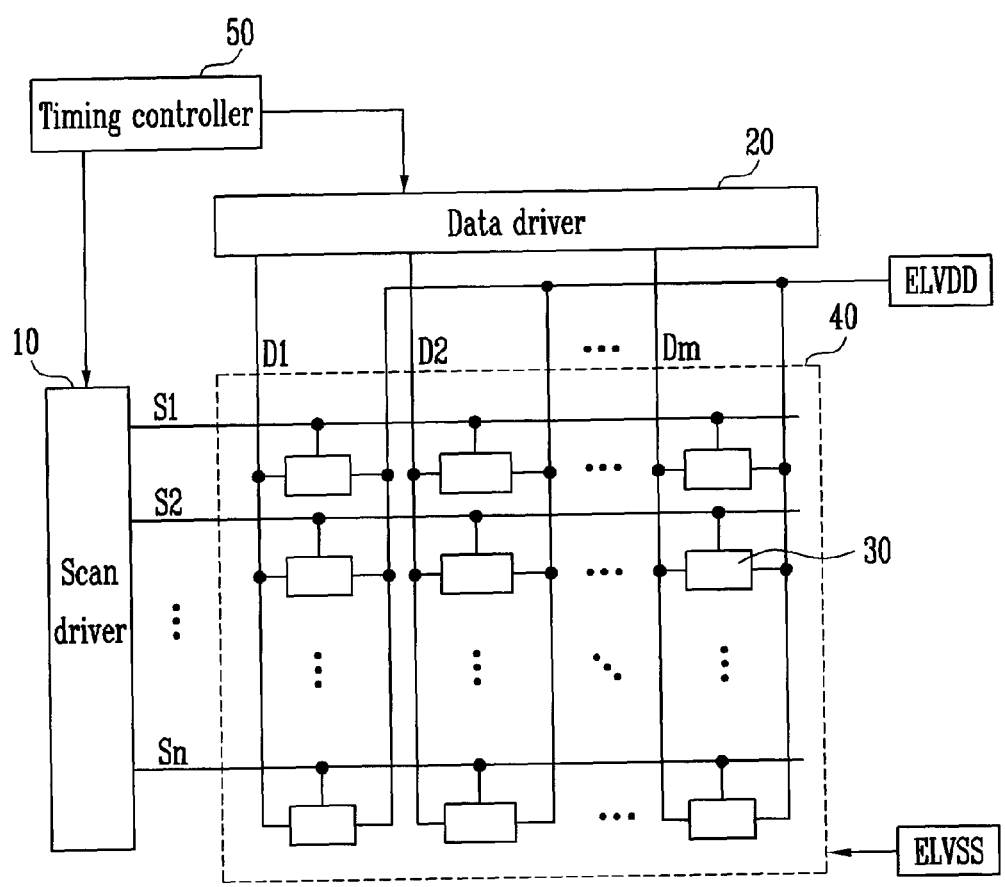
FIG. 1 is a block diagram showing an organic light emitting display according to an embodiment of the present invention.

Hereinafter, certain exemplary embodiments according to the present invention will be described with reference to the accompanying drawings. Here, when a first element is described as being coupled to a second element, the first element may be directly coupled to the second element or indirectly coupled to the second element via one or more third elements. Further, some of the elements that are not essential to the complete understanding of the invention are omitted for clarity. Also, like reference numerals refer to like elements throughout.

FIG. 1 is a block diagram showing an organic light emitting display according to an embodiment of the present invention.

Referring to FIG. 1, the organic light emitting display according to this embodiment includes a display unit 40 having pixels 30 positioned at crossing portions of scan lines S1 to Sn and data lines D1 to Dm; a scan driver 10 for driving the scan lines S1 to Sn; a data driver 20 for driving the data lines D1 to Dm; and a timing controller 50 for controlling the scan driver 10 and the data driver 20.

The scan driver 10 supplies a scan signal to the scan lines S1 to Sn. When the scan signal is supplied to the scan lines S1 to Sn, pixels 30 are selected. Here, the scan driver 10 concurrently (e.g., simultaneously) or progressively supplies the scan signal to the scan lines S1 to Sn, corresponding to a driving method.

The data driver 20 supplies a data signal to the data lines D1 to Dm in synchronization with the scan signal. Here, the data signal is supplied in synchronization with the progressively supplied scan signal.

Each of the pixels 30 stores a voltage corresponding to the data signal, and generates light with a set or predetermined luminance while supplying current corresponding to the stored voltage to an organic light emitting diode (not shown).

Figure 2:
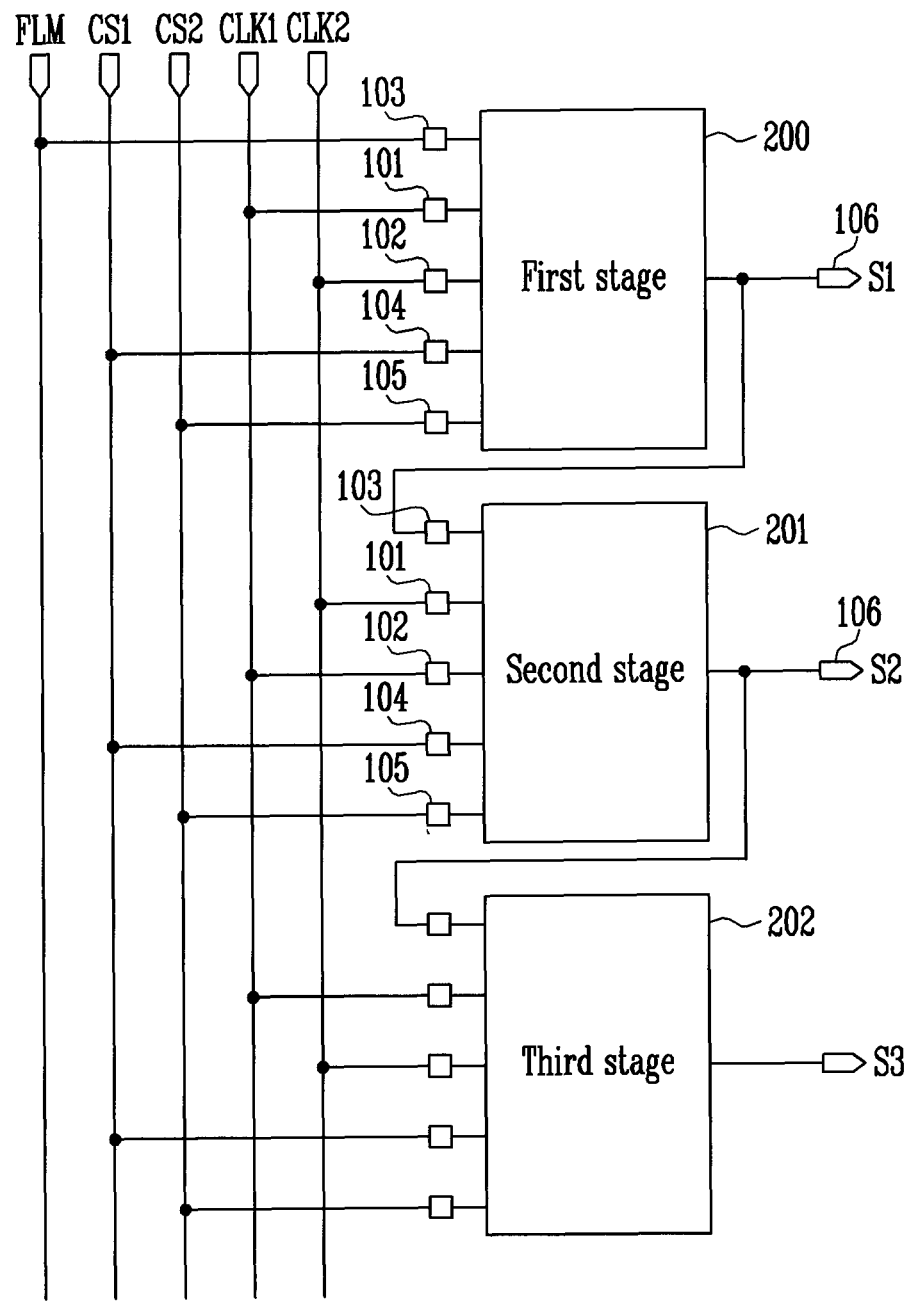
FIG. 2 is a block diagram schematically showing an embodiment of stages in a scan driver shown in FIG. 1.

FIG. 2 is a block diagram schematically showing an embodiment of stages in a scan driver shown in FIG. 1. For convenience of illustration, three stages are shown in FIG. 2.

Referring to FIG. 2, the scan driver 10 according to this embodiment includes stages 200, 201, and 202 to be respectively coupled to scan lines S1 to S3. Each of the stages 200, 201, and 202 is coupled to a corresponding one of the scan lines S1 to S3. Each of the stages 200, 201, and 202 is driven by two clock signals CLK1 and CLK2 and two control signals CS1 and CS2.

Each of the stages 200, 201, and 202 includes a first input terminal 101, a second input terminal 102, a third input terminal 103, a fourth input terminal 104, a fifth input terminal 105, and an output terminal 106.

The first input terminal 101 included in a k-th stage (where k is an odd or even number) receives the first clock signal CLK1, and the second input terminal 102 included in the k-th stage receives the second clock signal CLK2. The first input terminal 101 included in a (k+1)-th stage receives the second clock signal CLK2, and the second input terminal included in the (k+1)-th stage receives the first clock signal CLK1. The fourth input terminal 104 included in each of the stages 200 to 202 receives the first control signal CS1, and the fifth input terminal 105 included in each of the stages 200 to 202 receives the second control signal CS2. The third input terminal 103 included in each of the stages 200 to 202 receives a start signal FLM or an output signal supplied from a previous stage.

The stages 200 to 202 are configured to have the same circuit configuration, and concurrently (e.g., simultaneously) or progressively output a scan signal corresponding to the first control signal CS1.

Figure 3:
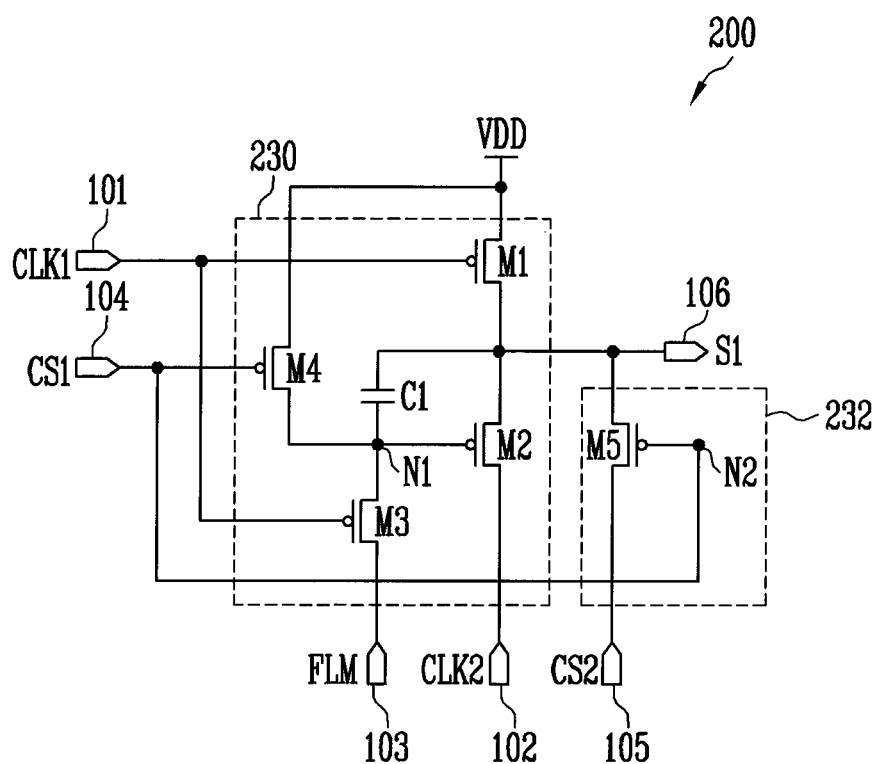
FIG. 3 is a circuit diagram schematically showing a first embodiment of the stage shown in FIG. 2.

FIG. 3 is a circuit diagram schematically showing a first embodiment of the stage shown in FIG. 2. For convenience of illustration, the stage 200 is shown in FIG. 3.

Referring to FIG. 3, the stage 200 according to this embodiment includes a progressive driver 230 and a concurrent driver 232.

The progressive driver 230 outputs a scan signal corresponding to the first clock signal CLK1, the second clock signal CLK2, the start signal FLM (or output signal supplied from the previous stage), and the first control signal CS1. The progressive driver 230 is used to progressively supply the scan signal to the scan lines S1 to Sn. To this end, the progressive driver 230 includes first to fourth transistors M1 to M4 and a first capacitor C1.

The first transistor M1 is coupled between a first power source VDD and the output terminal 106. A gate electrode of the first transistor M1 is coupled to the first input terminal 101. The first transistor M1 is turned on or off corresponding to the first clock signal CLK1 supplied to the first input terminal 101. When the first transistor M1 is turned on, a voltage of the first power source VDD (i.e., a high voltage) is supplied to the output terminal 106.

The second transistor M2 is coupled between the output terminal 106 and the second input terminal 102. A gate electrode of the second transistor M2 is coupled to a first node N1. The second transistor M2 is turned on or off corresponding to a voltage applied to the first node N1. When the second transistor M2 is turned on, the second input terminal 102 is electrically coupled to the output terminal 106.

The third transistor M3 is coupled between the first node N1 and the third input terminal 103. A gate electrode of the third transistor M3 is coupled to the first input terminal 101. The third transistor M3 is turned on or off corresponding to the first clock signal CLK1 supplied to the first input terminal 101.

The fourth transistor M4 is coupled between the first power source VDD and the first node N1. A gate electrode of the fourth transistor M4 is coupled to the fourth input terminal 104. The fourth transistor M4 is turned on or off corresponding to the first control signal CS1 supplied to the fourth input terminal 104. When the scan signal is progressively supplied from the scan driver 10, the first control signal CS1 is set to a high voltage. When the scan signal is concurrently (e.g., simultaneously) supplied from the scan driver 10, the first control signal CS1 is set to a low voltage.

The first capacitor C1 is coupled between the first node N1 and the output terminal 106. The first capacitor C1 is charged with a voltage corresponding to the turned-on/off state of the second transistor M2.

The concurrent driver 232 outputs a scan signal corresponding to the first control signal CS1 and the second control signal CS2. The concurrent driver 232 is used to concurrently (e.g., simultaneously) supply the scan signal to the scan lines S1 to Sn. To this end, the concurrent driver 232 includes a fifth transistor M5.

The fifth transistor M5 is coupled between the output terminal 106 and the fifth input terminal 105. A gate electrode of the fifth transistor M5 is coupled to the fourth input terminal 104 (or a second node N2). The fifth transistor M5 is turned on or off corresponding to the first control signal CS1. When the fifth transistor M5 is turned on, the fifth input terminal 105 is electrically coupled to the output terminal 106.

Figure 4A:
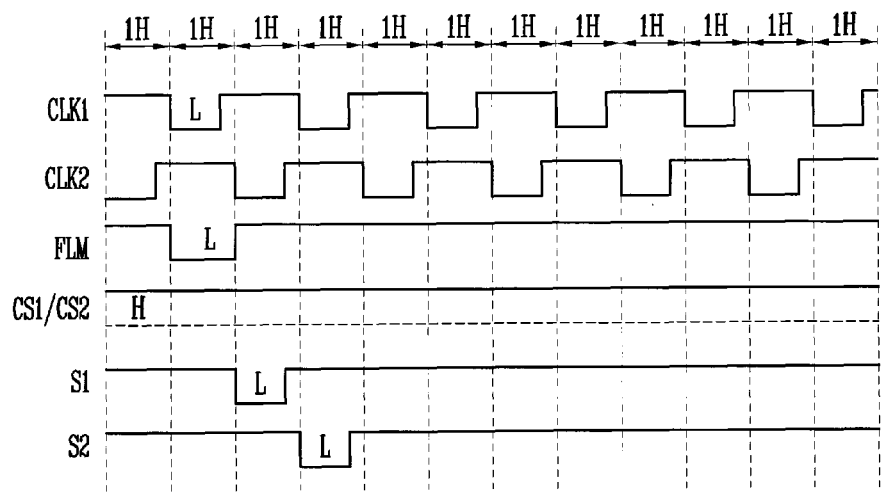
FIG. 4A is a waveform diagram illustrating a driving method for progressively outputting a scan signal in the stage shown in FIG. 3.

FIG. 4A is a waveform diagram illustrating a driving method for progressively outputting a scan signal in the stage shown in FIG. 3. In FIG. 4A, each of the clock signals CLK1 and CLK2 has a cycle of two horizontal periods 2H.

Referring to FIG. 4A, the first and second clock signals CLK1 and CLK2 are supplied as repeating high and low signals, and their low signals are not overlapped with each other. The first and second control signals CS1 and CS2 maintain the voltage of a high signal so that the scan signal can be progressively outputted. When a high signal is supplied as the first control signal CS1, the fourth and fifth transistors M4 and M5 maintain a turned-off state.

The operation process of the stage will be described in more detail. First, the first clock signal CLK1 (e.g., a low signal) is supplied to the first input terminal 101, and the start signal FLM is supplied to the third input terminal 103.

When the first clock signal CLK1 is supplied to the first input terminal 101, the first and third transistors M1 and M3 are turned on. When the first transistor M1 is turned on, the voltage of the first power source VDD is outputted to the output terminal 106. When the third transistor M3 is turned on, the first node N1 is electrically coupled to the third input terminal 103, and accordingly, the start signal FLM is supplied to the first node N1. When the start signal FLM is supplied to the first node N1, the second transistor M2 is turned on.

When the second transistor M2 is turned on, the output terminal 106 is electrically coupled to the second input terminal 102. In this instance, the second clock signal CLK2 (i.e., high signal) is not supplied, and hence the output terminal 106 stably maintains the voltage of the first power source VDD.

Then, the supply of the first clock signal CLK1 is stopped, and the second clock signal CLK2 is supplied to the second input terminal 102. When the supply of the first clock signal CLK1 is stopped, the first transistor M1 is turned off. In this instance, the second transistor M2 maintains a turned-on state corresponding to the voltage charged in the first capacitor C1. Thus, the second clock signal CLK2 supplied to the second input terminal 102 is supplied to the output terminal 106 via the second transistor M2. The second clock signal CLK2 supplied to the output terminal 106 is supplied as a scan signal to the scan line S1.

Then, the first clock signal CLK1 is supplied to the first input terminal 101. When the first clock signal CLK1 is supplied to the first input terminal 101, the first and third transistors M1 and M3 are turned on. When the first transistor M1 is turned on, the voltage of the first power source VDD is supplied to the output terminal 106. When the third transistor M3 is turned on, the third input terminal 103 is electrically coupled to the first node N1. In this instance, the start signal FLM is not supplied to the third input terminal 103, and accordingly, the second transistor M2 is set to a turned-off state. When the second transistor M2 is turned off, the first capacitor C1 is charged with a voltage corresponding to the turned-off state of the second transistor M2. Thus, when the second transistor M2 is turned off, the second clock signal CLK2 supplied posterior to the first clock signal CLK1, is not supplied to the output terminal 106.

As described above, in an embodiment of the present invention, a scan signal is outputted from the stage only when the start signal FLM (or the output signal supplied from the previous stage) is supplied in synchronization with the first clock signal CLK1 (or the second clock signal CLK2). Thus, each of the stages can progressively output the scan signal to the first to n-th scan lines S1 to Sn.

Figure 4B:
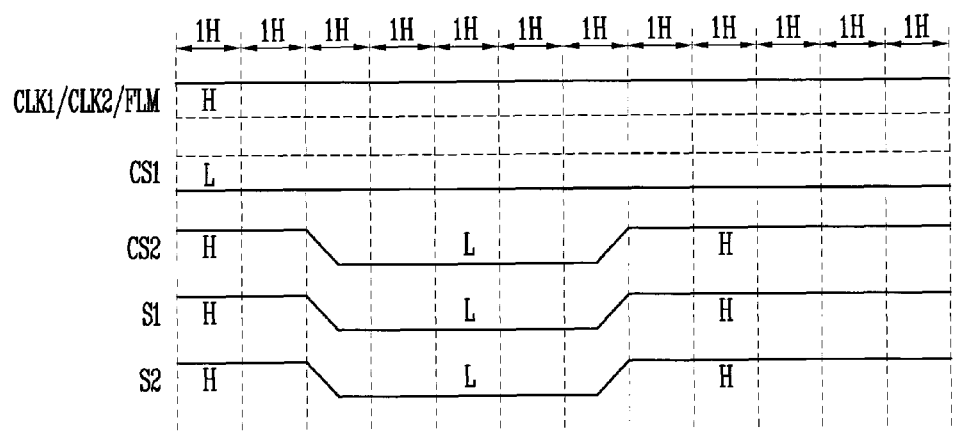
FIG. 4B is a waveform diagram illustrating a driving method for concurrently (e.g., simultaneously) outputting a scan signal in the stage shown in FIG. 3.

FIG. 4B is a waveform diagram illustrating a driving method for concurrently (e.g., simultaneously) outputting a scan signal in the stage shown in FIG. 3.

Referring to FIG. 4B, when the scan signal is concurrently (e.g., simultaneously) outputted, the first clock signal CLK1, the second clock signal CLK2, and the start signal FLM are not supplied (i.e., a high voltage is maintained). The first control signal CS1 (i.e., the voltage of a low signal) is supplied so that the scan signal can be concurrently (e.g., simultaneously) outputted. When the first control signal CS1 is supplied, the fourth and fifth transistor M4 and M5 are turned on.

When the fourth transistor M4 is turned on, the voltage of the first power source VDD is supplied to the first node N1. When the voltage of the first power source VDD is supplied to the first node N1, the second transistor M2 is turned on.

When the fifth transistor M5 is turned on, the fifth input terminal 105 is electrically coupled to the output terminal 106. In this case, the voltage supplied to the output terminal 106 is determined by the second control signal CS2 supplied to the fifth input terminal 105. That is, when a low voltage is supplied as the second control signal CS2, the low voltage is supplied to the output terminals 106 of all the stages. In an embodiment of the present invention, the scan signal can be concurrently (e.g., simultaneously) supplied to all the scan lines S1 to Sn, using the concurrent driver 232.

As described above, in an embodiment of the present invention, the scan signal can be progressively or concurrently (e.g., simultaneously) supplied to the scan lines S1 to Sn, using the stage circuit. Further, in an embodiment of the present invention, two clock signals are used in the stage circuit, thereby simplifying the circuit.

Here, although it has been shown in this embodiment that scan signals are supplied not to be overlapped with each other during one horizontal period (1H), the present invention is not limited thereto. Practically, scan signals can be supplied so that previous and current scan signals are overlapped (e.g., partially overlapped) with each other during a set or predetermined period, by controlling clock signals supplied to each of the stages.

Figure 5:
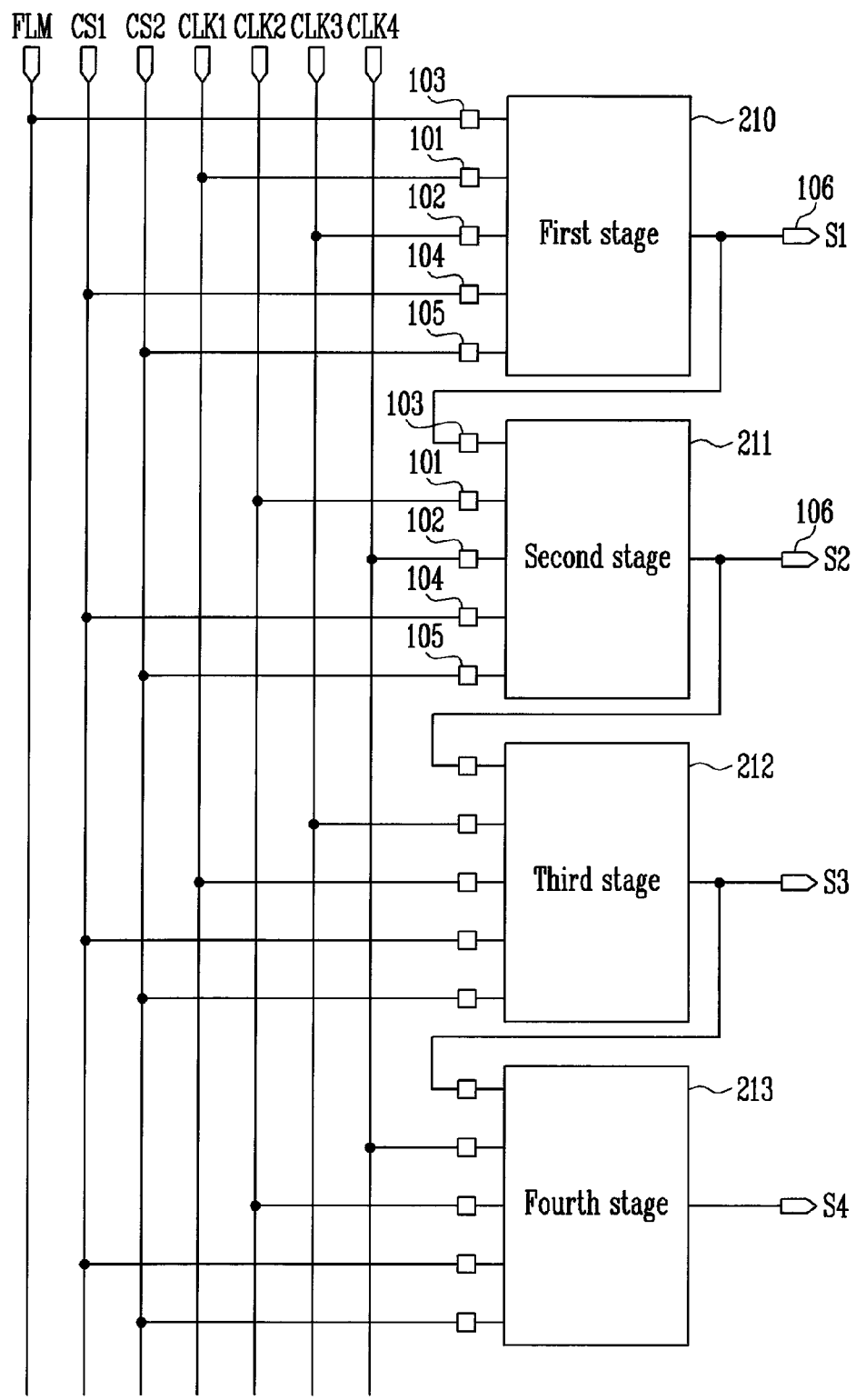
FIG. 5 is a block diagram showing another embodiment of the stages in the scan driver shown in FIG. 1.

FIG. 5 is a block diagram showing another embodiment of the stages in the scan driver shown in FIG. 1. For convenience of illustration, four stages 210 to 213 are shown in FIG. 5. In the description of FIG. 5, detailed descriptions of components identical to those of FIG. 2 will be omitted.

Referring to FIG. 5, each of the stages 210 to 213 is coupled to a corresponding one of scan lines S1 to S4. Each of the stages 210 to 213 is driven by two clock signals, either CLK1 and CLK3, or CLK2 and CLK4, and two control signals CS1 and CS2.

Each of the stages 210 to 213 includes a first input terminal 101, a second input terminal 102, a third input terminal 103, a fourth input terminal 104, a fifth input terminal 105, and an output terminal 106. Practically, a circuit of each of the stages 210 to 213 is identical to the circuit shown in FIG. 3.

Figure 6:
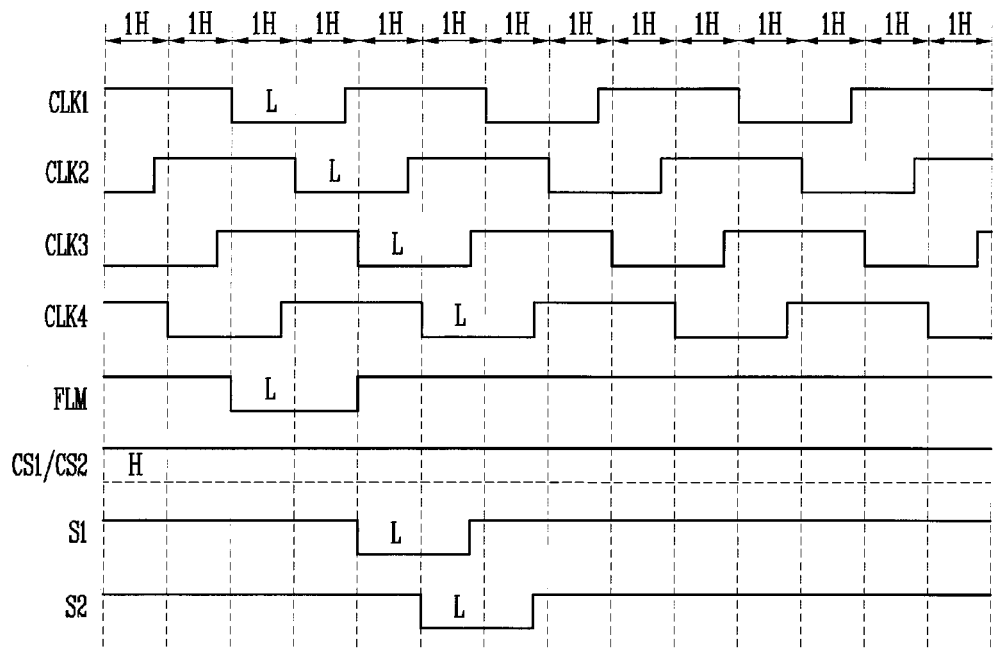
FIG. 6 is a waveform diagram showing driving waveforms supplied to the stage circuit shown in FIG. 5.

Among the stages 210 to 213, k-th stages receive the first and third clock signals CLK1 and CLK3. The first and third clock signals CLK1 and CLK3 each have a cycle of 4H as shown in FIG. 6, and their low periods are not overlapped with each other. In this case, the k-th stages output a scan signal corresponding to the first and third clock signals CLK1 and CLK3. The operation process of the stages is identical to that of FIG. 3, and hence its detailed description will be omitted.

Among the stages 210 to 213, (k+1)-th stages receive the second and fourth clock signals CLK2 and CLK4. The second and fourth clock signals CLK2 and CLK4 each have a cycle of 4H, and their low periods are not overlapped with each other. In this case, the (k+1)-th stages output a scan signal corresponding to the second and fourth clock signals CLK2 and CLK4.

In an embodiment of the present invention, the first to fourth clock signals CLK1 to CLK4 are progressively supplied, and their periods are partially overlapped. Here, the clock signals, either CLK1 and CLK3, or CLK2 and CLK4, supplied to the same stage (k or k+1) are not overlapped with each other, and hence the stages can progressively output a scan signal. However, the scan signal is overlapped (e.g., partially overlapped) with the previous scan signal during a set or predetermined period.

Figure 7:
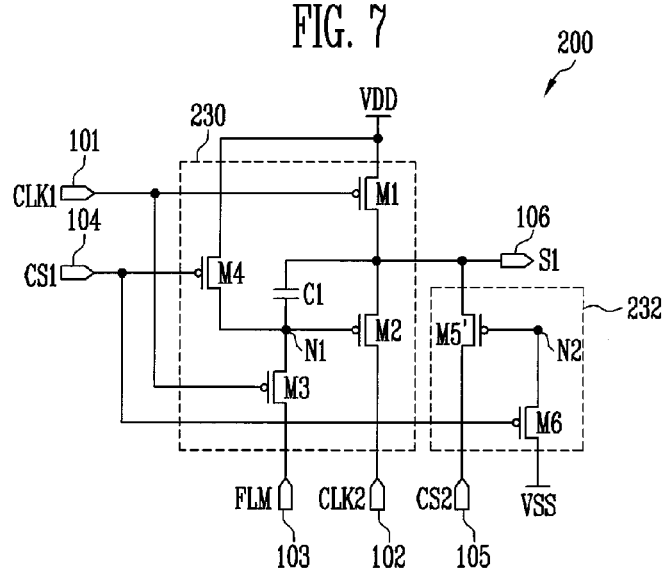
FIG. 7 is a circuit diagram schematically showing a second embodiment of the stages shown in FIG. 2.

FIG. 7 is a circuit diagram schematically showing a second embodiment of the stages shown in FIG. 2. In the description of FIG. 7, components identical to those of FIG. 3 are designated by like reference numerals, and their detailed descriptions will be omitted.

Referring to FIG. 7, the stage 200 according to this embodiment includes a progressive driver 230 and a concurrent driver 232.

The concurrent driver 232 includes a fifth transistor M5' and a sixth transistor M6. The fifth transistor M5' is coupled between the output terminal 106 and the fifth input terminal 105. A gate electrode of the fifth transistor M5' is coupled to a first electrode of the sixth transistor M6.

The sixth transistor M6 is coupled between the gate electrode of the fifth transistor M5' (or the second node N2) and a second power source VSS. A gate electrode of the sixth transistor M6 is coupled to the fourth input terminal 104. The sixth transistor M6 is turned on when the first control signal CS1 is supplied to the fourth input terminal 104. Here, the second power source VSS is set to a voltage lower than that of the first power source VDD.

The operation process of the stage will be described in more detail. The first control signal CS1 is supplied so as to concurrently (e.g., simultaneously) supply a scan signal to the scan lines S1 to Sn. When the first control signal CS1 is supplied, the fourth and sixth transistors M4 and M6 are turned on.

When the fourth transistor M4 is turned on, the voltage of the first power source VDD is supplied to the first node N1. When the voltage of the first power source VDD is supplied to the first node N1, the second transistor M2 is turned off.

When the sixth transistor M6 is turned on, the voltage of the second power source VSS is supplied to the gate electrode of the fifth transistor M5', and accordingly, the fifth transistor M5' is turned on. When the fifth transistor M5' is turned on, the fifth input terminal 105 is electrically coupled to the output terminal 106. Thus, when the second control signal CS2 (i.e., a low voltage) is supplied to the fifth input terminal 105, the scan signal is outputted to the output terminal 106.

Here, although it has been illustrated in FIG. 7 that the sixth transistor M6 is coupled between the second node N2 and the second power source VSS, the present invention is not limited thereto. For example, a second electrode of the sixth transistor M6, coupled to the second power source VSS, may be coupled to the fourth input terminal 104. In this case, the sixth transistor M6 is diode-coupled so as to change the voltage of the second node N2 corresponding to the voltage of the fourth input terminal 104. The diode-coupled configuration of the sixth transistor M6 is additionally shown in FIG. 10, and this will be described later in more detail.

Figure 8:
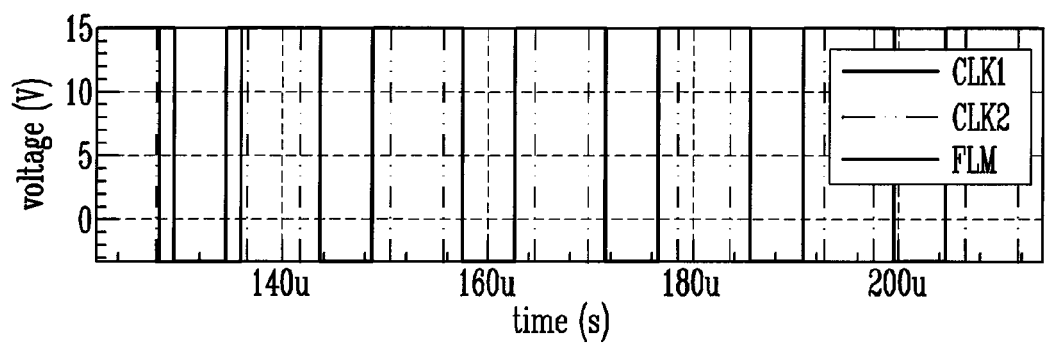
FIG. 8 is a simulation diagram showing an operating process of a progressive driver in the stage circuit shown in FIG. 3.
Figure 8:
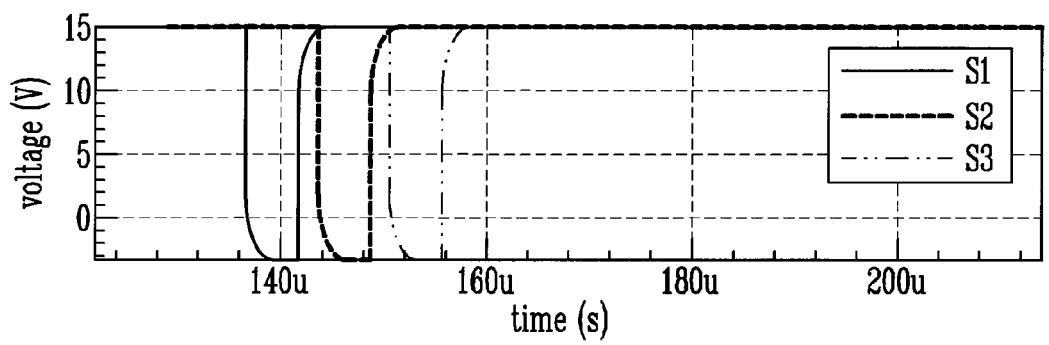

FIG. 8 is a simulation diagram showing an operating process of a progressive driver in the stage circuit shown in FIG. 3.

Referring to FIG. 8, a scan signal is progressively supplied to scan lines S1 to S3, corresponding to the first clock signal CLK1, the second clock signal CLK2, and the start signal FLM. That is, in an embodiment of the present invention, the scan signal can be stably supplied progressively to the scan lines S1 to Sn.

Figure 9:
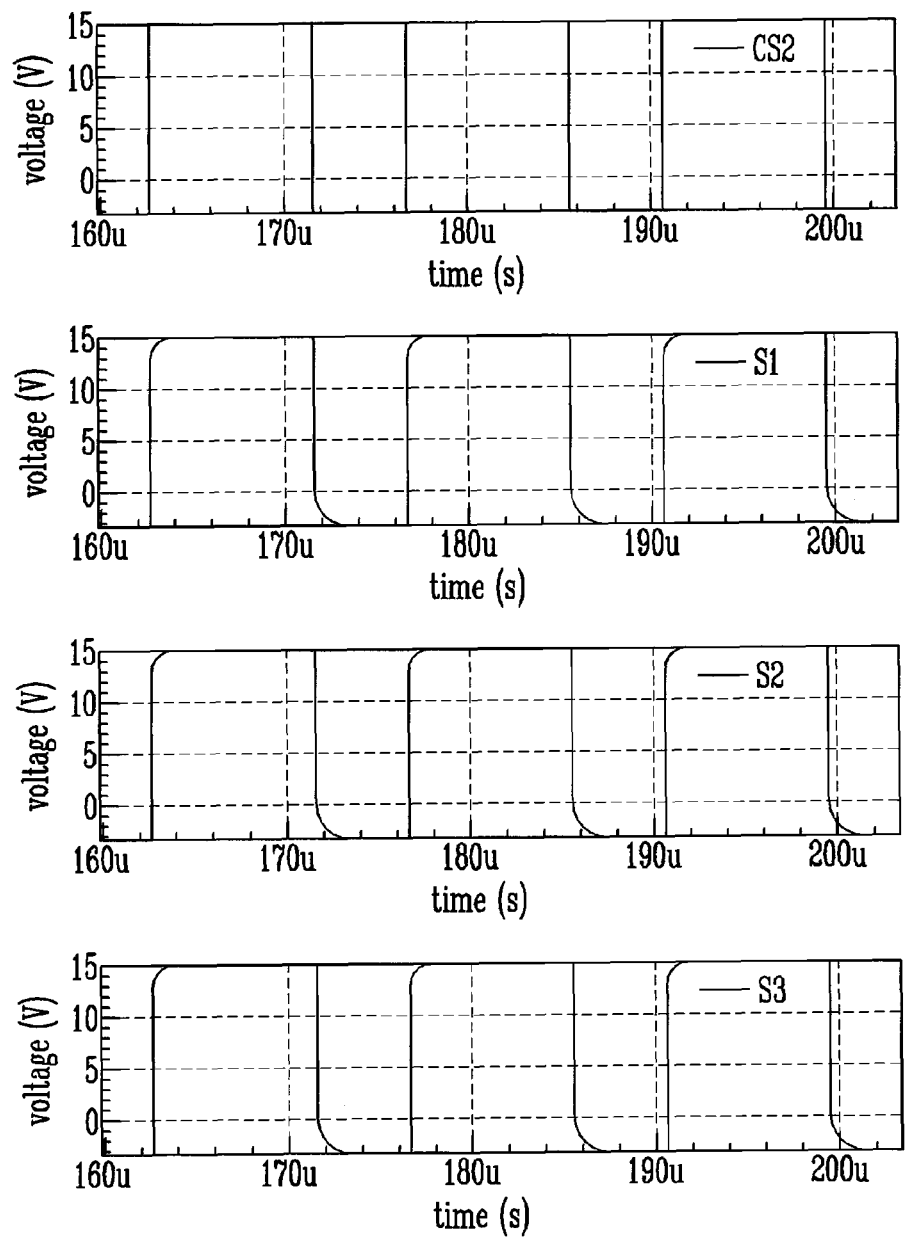
FIG. 9 is a simulation diagram showing an operating process of a concurrent driver in the stage circuit shown in FIG. 3.

FIG. 9 is a simulation diagram showing an operating process of a concurrent driver in the stage circuit shown in FIG. 3.

Referring to FIG. 9, an output signal supplied to the scan lines S1 to S3 is substantially identical to the second control signal CS2. That is, in an embodiment of the present invention, the scan signal can be stably supplied concurrently (e.g., simultaneously) to the scan lines S1 to Sn.

Figure 10:
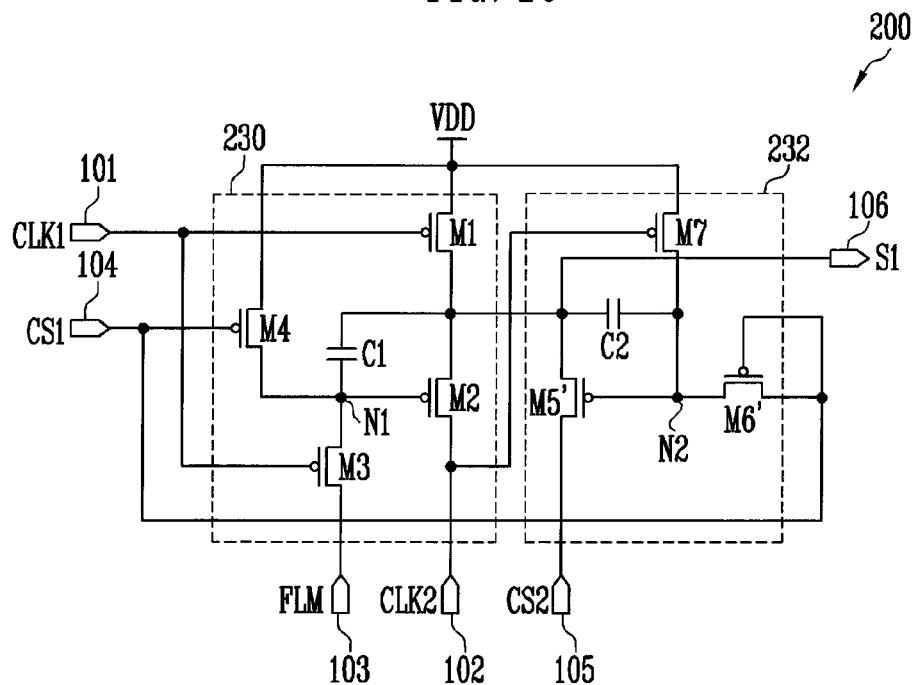
FIG. 10 is a circuit diagram schematically showing a third embodiment of the stages shown in FIG. 2.

FIG. 10 is a circuit diagram schematically showing a third embodiment of the stages shown in FIG. 2. In the description of FIG. 10, detailed descriptions of components identical to those of FIG. 3 will be omitted.

Referring to FIG. 10, the stage 200 according to this embodiment includes a progressive driver 230 and a concurrent driver 232.

The concurrent driver 232 includes a second capacitor C2, a fifth transistor M5', a sixth transistor M6', and a seventh transistor M7.

The fifth transistor M5' is coupled between the output terminal 106 and the fifth input terminal 105. A gate electrode of the fifth transistor M5' is coupled to the second node N2. The fifth transistor M5' is turned on or off corresponding to a voltage applied to the second node N2.

The sixth transistor M6' is coupled between the second node N2 and the fourth input terminal 104. A gate electrode of the sixth transistor M6' is coupled to the fourth input terminal 104. The sixth transistor M6' is diode-coupled so that current can flow from the second node N2 to the fourth input terminal 104.

The seventh transistor M7 is coupled between the second node N2 and the first power source VDD. A gate electrode of the seventh transistor M7 is coupled to the second input terminal 102. The seventh transistor M7 is turned on when the second clock signal CLK2 is supplied to the second input terminal 102.

The second capacitor C2 is coupled between the second node N2 and the output terminal 106. The second capacitor C2 stores a voltage corresponding to the turned-on or turned-off state of the fifth transistor M5'.

The operating process of the stage will be described in conjunction with FIG. 4B. First, the first control signal CS1 is supplied so as to concurrently (e.g., simultaneously) supply a scan signal to the scan lines S1 to Sn. The first clock signal CLK1, the second clock signal CLK2, and the start signal FLM are not supplied during a concurrent (e.g., simultaneous) driving period (i.e., a high voltage is maintained).

When the first control signal CS1 is supplied, the fourth and sixth transistors M4 and M6' are turned on. When the fourth transistor M4 is turned on, a high voltage is supplied to the first node N1 so that the second transistor M2 is turned off.

When the sixth transistor M6' is turned on, the voltage of the second node N2 is lowered, and accordingly, the fifth transistor M5' is turned on. When the fifth transistor M5' is turned on, the fifth input terminal 105 is electrically coupled to the output terminal 106. Thus, when the second control signal CS2 is supplied to the fifth input terminal 105, the scan signal is outputted to the output terminal 106.

Here, the supply of the first control signal CS1 is stopped during a period in which the scan signal is progressively outputted so that the fourth and sixth transistors M4 and M6' are turned off. Then, the seventh transistor M7 is turned on when the second clock signal CLK2 is supplied. When the seventh transistor M7 is turned on, the voltage of the first power source VDD is supplied to the second node N2, and accordingly, the fifth transistor M5' is turned off. The second capacitor C2 is charged with a voltage corresponding to the turned-off state of the fifth transistor M5'. Thus, although the supply of the second clock signal CLK2 is stopped, the fifth transistor M5' stably maintains a turned-off state, corresponding to the voltage charged in the second capacitor C2.

Figure 11:
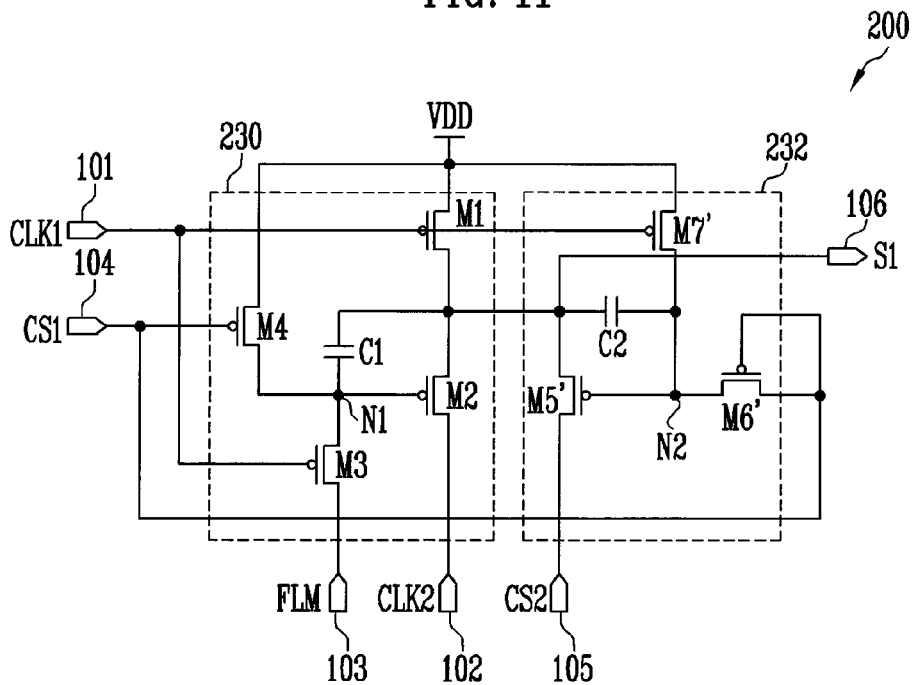
FIG. 11 is a circuit diagram schematically showing a fourth embodiment of the stages shown in FIG. 2.

FIG. 11 is a circuit diagram schematically showing a fourth embodiment of the stages shown in FIG. 2. In the description of FIG. 11, detailed descriptions of components identical to those of FIG. 10 will be omitted.

Referring to FIG. 11, the stage 200 according to this embodiment includes a progressive driver 230 and a concurrent driver 232.

A seventh transistor M7' included in the concurrent driver 232 is coupled between the second node N2 and the first power source VDD. A gate electrode of the seventh transistor M7' is coupled to the first input terminal 101.

When the first clock signal CLK1 is supplied, the seventh transistor M7' is turned on so that the voltage of the first power source VDD is supplied to the second node N2. The operating process except the seventh transistor M7' is identical to that of FIG. 10, and therefore, its detailed description will be omitted.

Figure 12:
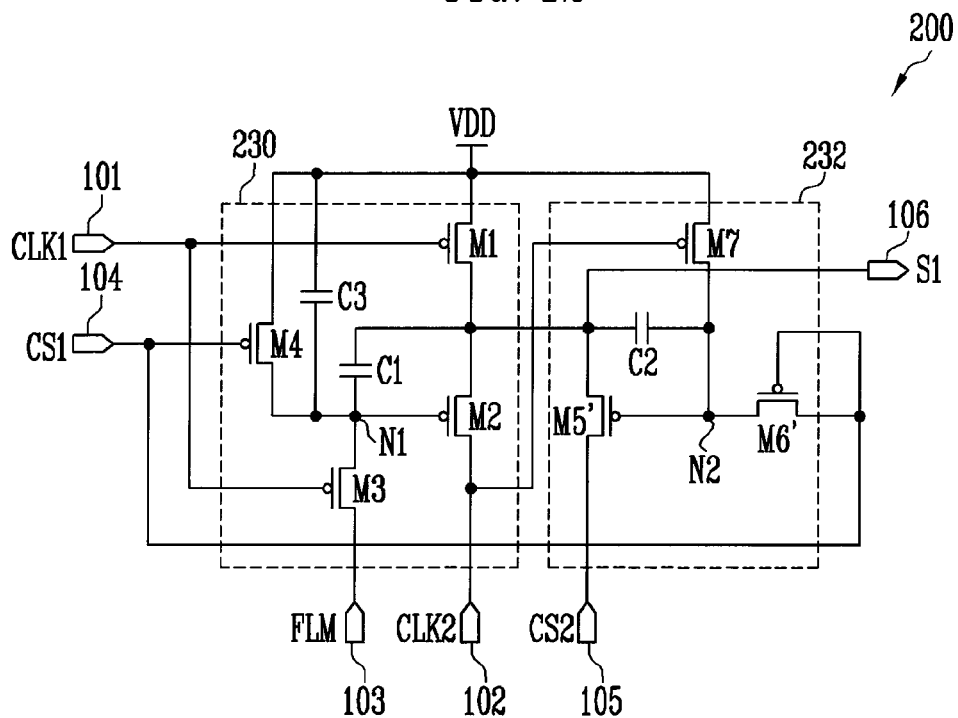
FIG. 12 is a circuit diagram schematically showing a fifth embodiment of the stages shown in FIG. 2.

FIG. 12 is a circuit diagram schematically showing a fifth embodiment of the stages shown in FIG. 2. In the description of FIG. 12, detailed descriptions of components identical to those of FIG. 10 will be omitted.

Referring to FIG. 12, the stage 200 according to this embodiment includes a progressive driver 230 and a concurrent driver 232.

The progressive driver 230 further includes a third capacitor C3 positioned coupled between the first node N1 and the first power source VDD. Here, the third capacitor C3 is coupled between the first power source VDD and the first node N1, and hence the voltage of the first node N1 can be stabilized based on the voltage of the first power source VDD. That is, in an embodiment of the present invention, the third capacitor C3 is added to the progressive driver 230, thereby ensuring the stability of driving.

In the present invention, each of the embodiments may be variously applied. For example, the third capacitor C3 may be applied to the progressive driver 230 of each of the first to fourth embodiments.

Figure 13:
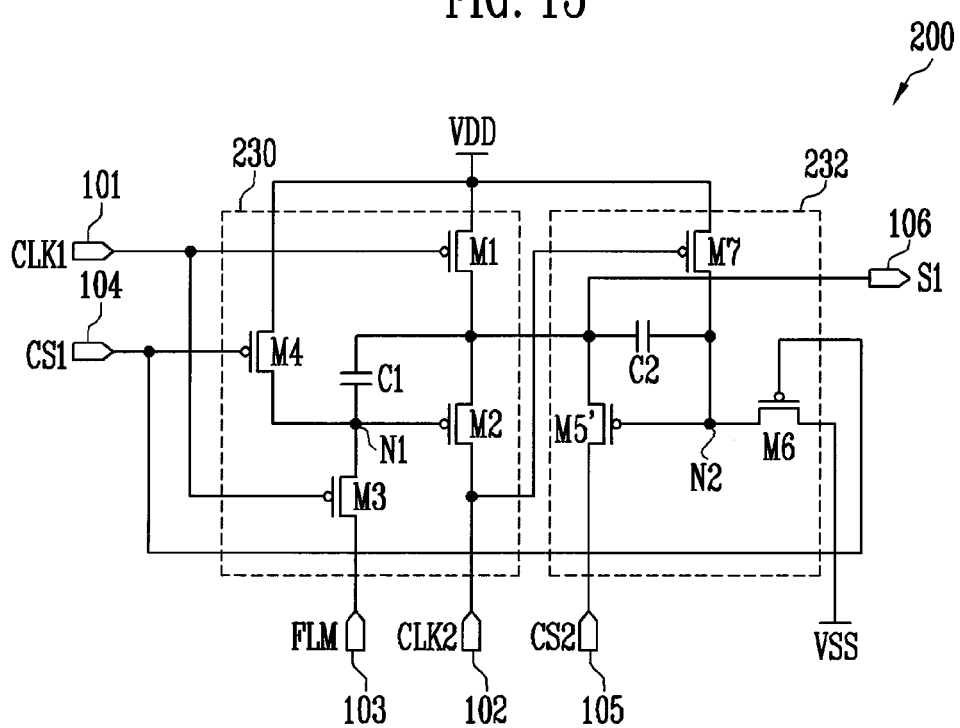
FIG. 13 is a circuit diagram schematically showing a sixth embodiment of the stages shown in FIG. 2.

The sixth transistor M6' shown in FIG. 10 may be modified and applied, like the sixth transistor M6 shown in FIG. 7. For example, the sixth transistor M6 may be applied to the embodiment of FIG. 10 as shown in FIG. 13. In this case, when the sixth transistor M6 is turned on, the voltage of the second node N2 is lowered to the voltage of the second power source VSS so that the fifth transistor M5' is turned on. That is, the embodiments of the present invention may be variously applied by those skilled in the art.

Figure 14:
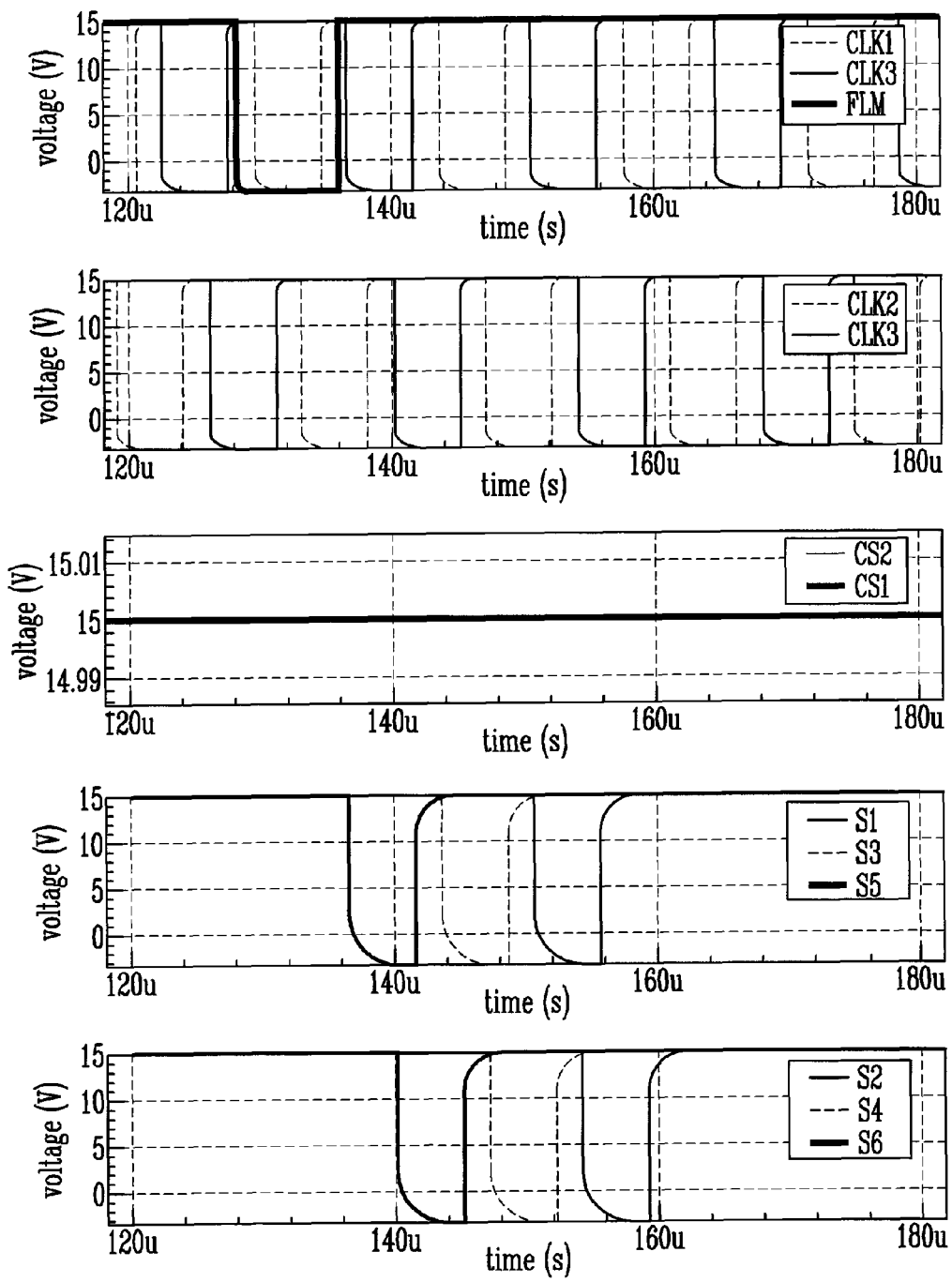
FIG. 14 is a simulation diagram showing an operating process of a progressive driver in the stage circuit shown in FIG. 10.

FIG. 14 is a simulation diagram showing an operating process of the progressive driver in the stage circuit shown in FIG. 10. FIG. 14 shows a case where the clock signals, either CLK1 and CLK3, or CLK2 and CLK4, supplied to the k-th and (k+1)-th stages are different from each other as shown in FIG. 5.

Referring to FIG. 14, each of the stages progressively supplies a scan signal, corresponding to the clock signals, either CLK1 and CLK3, or CLK2 and CLK4. In this instance, the scan signal supplied to the previous scan line (e.g., Si) and the scan signal outputted to the current scan line Si+1 are overlapped with each other during approximately one horizontal period (1H).

Figure 15:
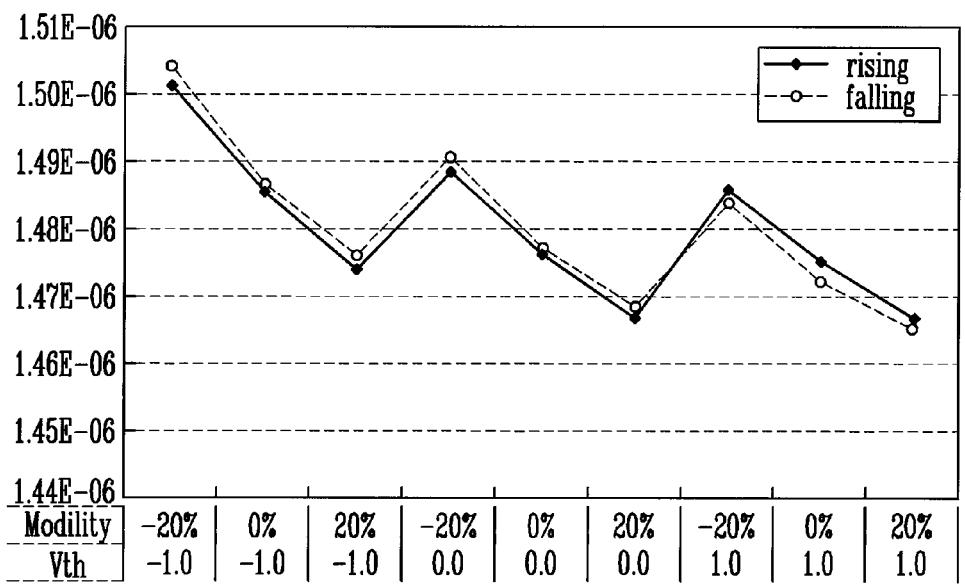
FIG. 15 is a graph showing an operating speed of the stage circuit shown in FIG. 10 when a scan signal is progressively outputted.

FIG. 15 is a graph showing an operating speed of the stage circuit shown in FIG. 10 when a scan signal is progressively outputted.

Referring to FIG. 15, when the threshold voltages of transistors change from −1V through 0V to 1V and the mobilities of the transistors change from −20% through 0% to 20% at the same time, the response speeds of the transistors are 2 μs or less. Generally, the scan driver can be stably driven when the response speed of the scan driver is 2 μs or less. That is, when the scan driver is implemented using the stage circuit of the present invention, it is possible to ensure a stable driving speed.

Figure 16:
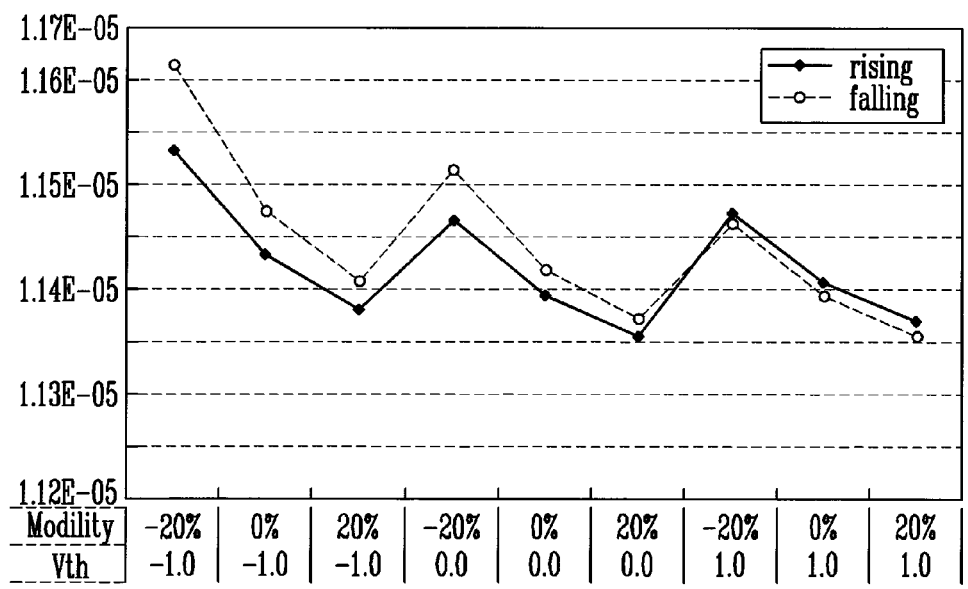
FIG. 16 is a graph showing an operating speed of the stage circuit shown in FIG. 10 when a scan signal is concurrently (e.g., simultaneously) outputted.

FIG. 16 is a graph showing an operating speed of the stage circuit shown in FIG. 10 when a scan signal is concurrently (e.g., simultaneously) outputted.

Referring to FIG. 16, when the threshold voltages of transistors change from −1V though 0V to 1V and the mobilities of the transistors change from −20% through 0% to 20% at the same time, the response speeds of the transistors are 2 μs or less. Thus, when the scan driver is implemented using the stage circuit of the present invention, a scan signal can be stably supplied concurrently (e.g., simultaneously) to the scan lines S1 to Sn.

Figure 17:
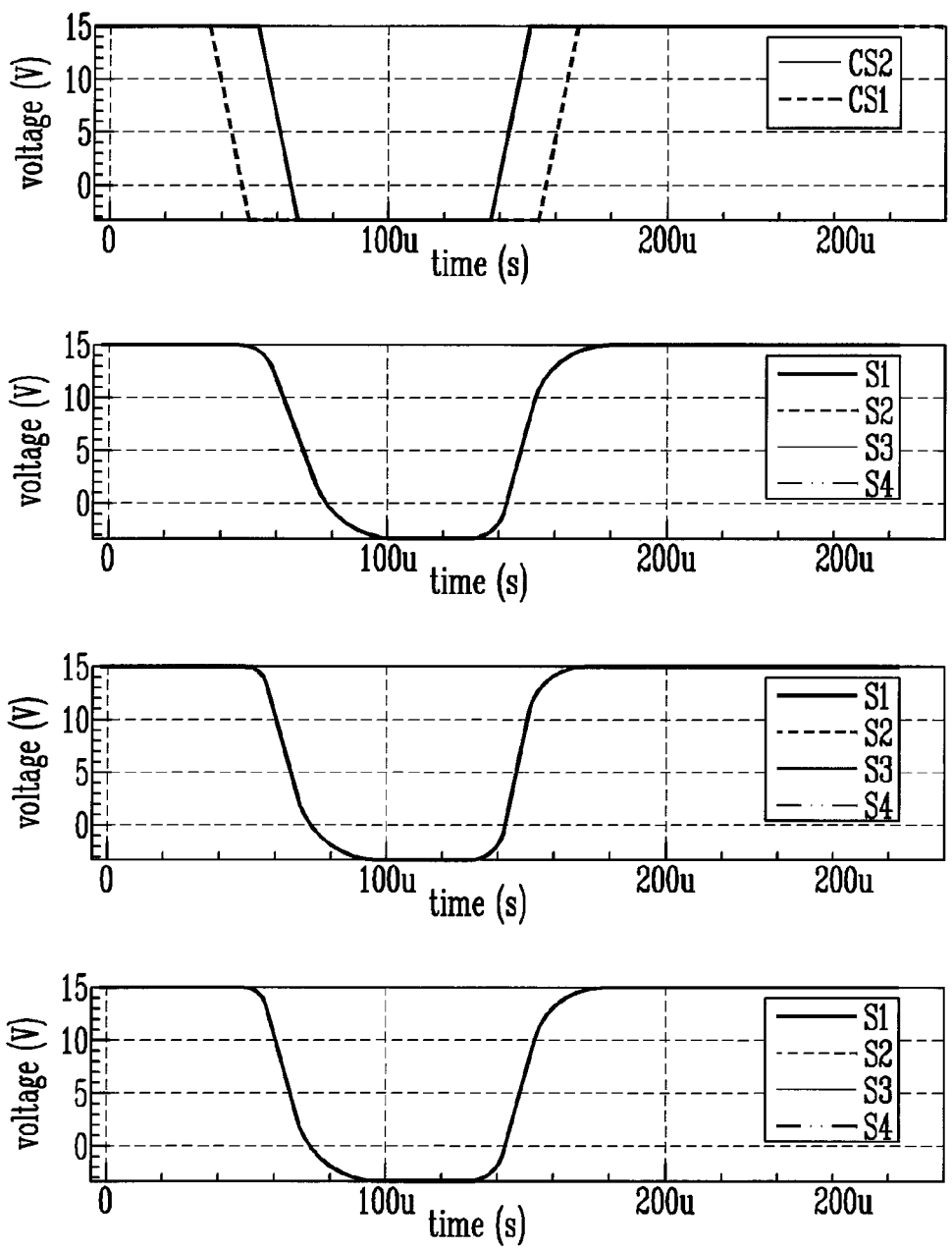
FIG. 17 is a simulation result showing output waveforms corresponding to changes in mobility and threshold voltage when a scan signal is concurrently (e.g., simultaneously) outputted.

FIG. 17 is a simulation result showing output waveforms corresponding to changes in mobility and threshold voltage when a scan signal is concurrently (e.g., simultaneously) outputted.

Referring to FIG. 17, when the threshold voltages of transistors included in each of the stages change from −1V through 0V to 1V and the mobilities of the transistors change from −20% through 0% to 20% at the same time, the output of each of the stages changes in accordance with the voltage of the second control signal CS2. That is, in an embodiment of the present invention, a scan signal can be stably supplied concurrently (e.g., simultaneously) to the scan lines S1 to Sn, corresponding to the voltage of the second control signal CS2.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A stage circuit comprising:
a progressive driver comprising a first transistor coupled between a first power source and an output terminal of the stage circuit, a gate electrode of the first transistor being directly coupled to a first input terminal of the stage circuit; a second transistor coupled between the output terminal and a second input terminal of the stage circuit, a gate electrode of the second transistor being coupled to a first node; a third transistor coupled between the first node and a third input terminal of the stage circuit, a gate electrode of the third transistor being coupled to the first input terminal; a fourth transistor coupled between the first power source and the first node, a gate electrode of the fourth transistor being coupled to a fourth input terminal of the stage circuit; and a first capacitor coupled between the first node and the output terminal; and
a concurrent driver comprising a fifth transistor coupled between the output terminal and a fifth input terminal of the stage circuit, a gate electrode of the fifth transistor being coupled to a second node.

2. The stage circuit according to claim 1, wherein the second node is coupled to the fourth input terminal.

3. The stage circuit according to claim 1, wherein the first and second input terminals are configured to receive clock signals of which phases are opposite to each other.

4. The stage circuit according to claim 1, wherein the first input terminal is configured to receive a first clock signal, and the second input terminal is configured to receive a second clock signal that is not overlapped with the first clock signal during a low-voltage period.

5. The stage circuit according to claim 1, wherein the third input terminal is configured to receive an output signal of a previous stage circuit or a start signal in synchronization with a clock signal supplied to the first input terminal.

6. The stage circuit according to claim 1, wherein the fourth input terminal is configured to receive a first control signal, and the fifth input terminal is configured to receive a second control signal.

7. The stage circuit according to claim 6, wherein the first control signal is set to a high voltage during a period in which the progressive driver is configured to supply a scan signal, and is set to a low voltage during a period in which the concurrent driver is configured to supply a scan signal.

8. The stage circuit according to claim 7, wherein the second control signal is set to a low voltage so that the scan signal is supplied to the output terminal during a portion of the period in which the first control signal is set to the low voltage.

9. The stage circuit according to claim 1, wherein the concurrent driver further comprises a sixth transistor coupled between the second node and a second power source having a voltage lower than that of the first power source, a gate electrode of the sixth transistor being coupled to the fourth input terminal.

10. The stage circuit according to claim 9, wherein the concurrent driver further comprises:

a seventh transistor coupled between the second node and the first power source, a gate electrode of the seventh transistor being coupled to the second input terminal; and a second capacitor coupled between the second node and the output terminal.

11. The stage circuit according to claim 9, wherein the concurrent driver further comprises:

a seventh transistor coupled between the second node and the first power source, a gate electrode of the seventh transistor being coupled to the first input terminal; and a second capacitor coupled between the second node and the output terminal.

12. The stage circuit according to claim 1, wherein the concurrent driver further comprises a sixth transistor coupled between the second node and the fourth input terminal, a gate electrode of the sixth transistor being coupled to the fourth input terminal.

13. The stage circuit according to claim 12, wherein the concurrent driver further comprises:

a seventh transistor coupled between the second node and the first power source, and a gate electrode of the seventh transistor being coupled to the second input terminal; and a second capacitor coupled between the second node and the output terminal.

14. The stage circuit according to claim 12, wherein the concurrent driver further comprises:

a seventh transistor coupled between the second node and the first power source, a gate electrode of the seventh transistor being coupled to the first input terminal; and a second capacitor coupled between the second node and the output terminal.

15. The stage circuit according to claim 1, wherein the progressive driver further comprises a third capacitor coupled between the first node and the first power source.

16. A scan driver comprising a plurality of stage circuits each configured according to the stage circuit of claim 1, the stage circuits respectively coupled to scan lines so as to supply a scan signal to the scan lines.

17. A scan driver comprising stage circuits respectively coupled to scan lines so as to supply a scan signal to the scan lines, wherein a stage circuit of the stage circuits comprises:

a progressive driver comprising a first transistor coupled between a first power source and an output terminal of the stage circuit, a gate electrode of the first transistor being directly coupled to a first input terminal of the stage circuit; a second transistor coupled between the output terminal and a second input terminal of the stage circuit, a gate electrode of the second transistor being coupled to a first node; a third transistor coupled between the first node and a third input terminal of the stage circuit, a gate electrode of the third transistor being coupled to the first input terminal; a fourth transistor coupled between the first power source and the first node, a gate electrode of the fourth transistor being coupled to a fourth input terminal of the stage circuit; and a first capacitor coupled between the first node and the output terminal; and a concurrent driver comprising a fifth transistor coupled between the output terminal and a fifth input terminal of the stage circuit, a gate electrode of the fifth transistor being coupled to a second node.

18. The scan driver according to claim 17, wherein the second node is coupled to the fourth input terminal.

19. The scan driver according to claim 17, wherein:

the first input terminal of a k-th stage circuit (where k is an odd or even number) of the stage circuits is configured to receive a first clock signal, and the second input terminal of the k-th stage circuit is configured to receive a second clock signal having a phase that is opposite to that of the first clock signal; and the first input terminal of a (k+1)-th stage circuit of the stage circuits is configured to receive the second clock signal, and the second input terminal of the (k+1)-th stage circuit is configured to receive the first clock signal.

20. The scan driver according to claim 17, wherein:

the first input terminal of a k-th stage circuit (where k is an odd or even number) of the stage circuits is configured to receive a first clock signal, and the second input terminal of the k-th stage circuit is configured to receive a third clock signal having a low voltage that is not overlapped with that of the first clock signal; and the first input terminal of a (k+1)-th stage circuit of the stage circuits is configured to receive a second clock signal, and the second input terminal of the (k+1)-th stage circuit is configured to receive a fourth clock signal having a low voltage that is not overlapped with that of the second clock signal.

21. The scan driver according to claim 20, wherein the first to fourth clock signals are progressively supplied, and low voltages of previous and current clock signals are overlapped with each other during a partial period.

22. The scan driver according to claim 17, wherein the third input terminal is configured to receive an output signal of a previous stage circuit or a start signal in synchronization with a clock signal supplied to the first input terminal.

23. The scan driver according to claim 17, wherein the fourth input terminal is configured to receive a first control signal, and the fifth input terminal is configured to receive a second control signal.

24. The scan driver according to claim 23, wherein the first control signal is set to a high voltage during a period in which the progressive driver is configured to supply a scan signal, and is set to a low voltage during a period in which the concurrent driver is configured to supply a scan signal.

25. The scan driver according to claim 24, wherein the second control signal is set to a low voltage so that the scan signal is supplied to the output terminal during a portion of the period in which the first control signal is set to the low voltage.

* * * * *